United States Patent
Likens et al.

(10) Patent No.: US 12,525,964 B2
(45) Date of Patent: Jan. 13, 2026

(54) THREE-STAGE DIFFERENTIAL RING OSCILLATOR GENERATING DIFFERENTIAL IN-PHASE AND QUADRATURE-PHASE CLOCKS

(71) Applicant: Advanced Micro Devices, Inc., Santa Clara, CA (US)

(72) Inventors: Thomas H. Likens, Austin, TX (US); Gerald R. Talbot, Concord, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/831,013

(22) Filed: Jun. 2, 2022

(65) Prior Publication Data

US 2023/0396240 A1    Dec. 7, 2023

(51) Int. Cl.
*H03K 3/03* (2006.01)
*G06F 1/06* (2006.01)

(52) U.S. Cl.
CPC ............ *H03K 3/0322* (2013.01); *G06F 1/06* (2013.01)

(58) Field of Classification Search
CPC ................................ H03K 3/0322; G06F 1/06
See application file for complete search history.

(56) References Cited

U.S. PATENT DOCUMENTS

| | | | | |
|---|---|---|---|---|
| 7,071,789 B2 * | 7/2006 | Gu | ....................... | H03K 3/0315 331/46 |
| 7,683,725 B2 * | 3/2010 | Kim | ..................... | H03K 5/1506 331/46 |
| 8,536,917 B2 * | 9/2013 | Hertle | ................. | H03K 5/1565 327/175 |
| 9,680,480 B1 * | 6/2017 | Fredenburg | ............ | H03L 7/099 |
| 9,698,798 B1 * | 7/2017 | Fredenburg | ............... | G06F 1/08 |
| 9,762,249 B1 * | 9/2017 | Faisal | ................... | H03L 7/0998 |
| 10,014,868 B1 * | 7/2018 | Raj | .......................... | H03L 7/24 |
| 10,237,052 B1 * | 3/2019 | Moscone | ............... | H03L 7/081 |
| 10,333,533 B1 * | 6/2019 | Moscone | ............... | H03H 11/00 |

(Continued)

OTHER PUBLICATIONS

Suraparaju, E.R., et al., "A 1.1-8.2 GHz Tuning Range In-Phase and Quadrature Output DCO Design in 90 nm CMOS Technology," 2015 IEEE 58th International Midwest Symposium on Circuits and Systems (MWSCAS), Aug. 2-5, 2015, 4 pages.

*Primary Examiner* — Menatoallah Youssef
*Assistant Examiner* — Khareem E Almo
(74) *Attorney, Agent, or Firm* — Zagorin Cave LLP

(57) ABSTRACT

A three-stage differential ring oscillator circuit has a first differential stage, a second differential stage, and a third differential stage and generates six phases (two in each stage) used to form differential in-phase and quadrature-phase clock signals. A cross coupled inverter pair couples the first stage output signals. A second cross coupled inverter pair couples the second stage output signals. A third cross coupled inverter pair couples the third stage output signals. A first interpolator generates a first quadrature-phase clock signal using two phases (one from the positive portion of the second stage and one from the negative portion of the third stage) and a second interpolator generates a second quadrature-phase clock signal using two phases (one from the negative portion of the second stage and one from the positive portion of the third stage). Two phases from the first differential stage form the differential pair of in-phase clock signals.

20 Claims, 6 Drawing Sheets

(56) References Cited

U.S. PATENT DOCUMENTS 10,742,224 B2 * 8/2020 Chen ................... H03K 3/0315
11,728,962 B2 * 8/2023 Ma ......................... H03K 19/21
                                                                375/354
12,189,413 B2 * 1/2025 Wang ................... H03B 27/00

* cited by examiner

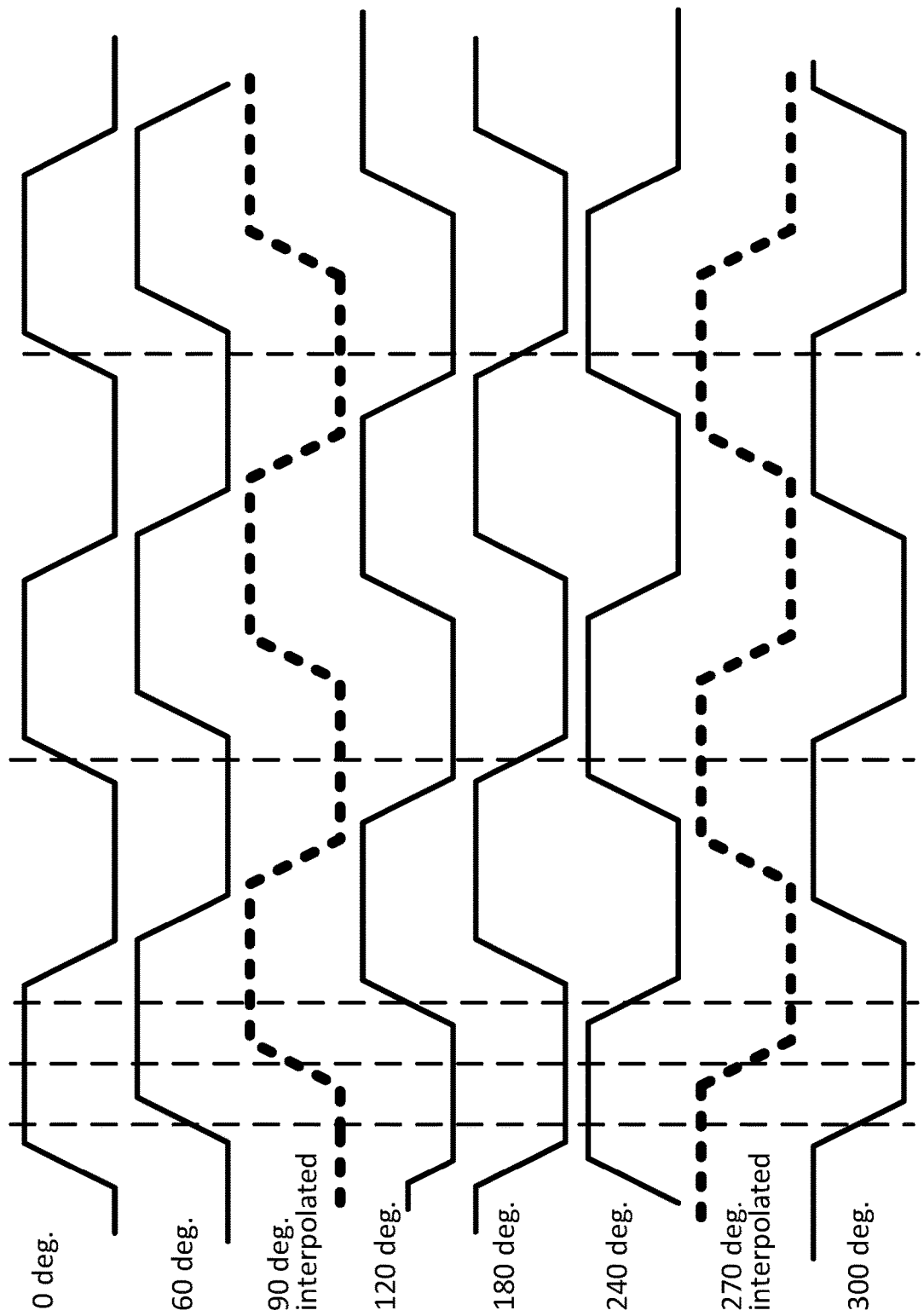

THREE-STAGE DIFFERENTIAL RING OSCILLATOR GENERATING DIFFERENTIAL IN-PHASE AND QUADRATURE-PHASE CLOCKS

BACKGROUND

Field of the Invention

This disclosure relates to generation of in-phase and quadrature-phase clock signals.

Description of the Related Art

In-phase (I) and quadrature-phase (Q) clock signals (clock signals 90° apart) are used in various high speed communication systems. A previous approach for generating IQ clock signals used four-stage ring oscillators. While use of a four-stage ring oscillator is satisfactory, improvements in generation of IQ clocks is desirable.

SUMMARY OF EMBODIMENTS OF THE INVENTION

In one embodiment, an apparatus includes a three-stage differential ring oscillator circuit having a first stage, a second stage, and a third stage. A first interpolator is coupled to a positive portion of the second stage and a negative portion of the third stage to generate a first quadrature-phase clock signal of a differential pair of quadrature clock signals. A second interpolator is coupled to a negative portion of the second stage and a positive portion of the third stage to generate a second quadrature-phase clock signal of the differential pair quadrature clock signals.

In another embodiment a method includes generating six clock signal phases in a three-stage differential ring oscillator circuit and generating a differential pair of in-phase clock signals and a differential pair of quadrature-phase clock signals using the six clock signal phases.

In an embodiment the method further includes generating a first quadrature-phase clock signal of the differential pair of quadrature-phase clock signals by interpolating between a first signal derived from a positive portion of a second stage of the three-stage differential ring oscillator and a second signal derived from a negative portion of a third stage of the three-stage differential ring oscillator.

In an embodiment the method further includes generating a second quadrature-phase clock signal of the differential pair of quadrature-phase clock signals by interpolating between a third signal derived from a negative portion of the second stage and a fourth signal derived from a positive portion of the third stage.

In another embodiment, an apparatus includes a three-stage differential ring oscillator circuit that generates six clock signal phases. A first interpolator interpolates between a first phase and a second phase of the six clock signal phases to generate a first clock signal of a first differential pair of clock signals. A second interpolator interpolates between a third phase and a fourth phase of the six clock signal phases to generate a second clock signal of the first differential pair of clock signals. A third clock signal of a second differential pair of clock signals is generated based on a fifth phase of the six clock signal phases and a fourth clock signal of the second differential pair of clock signals is based on a sixth phase of the six clock signal phases.

BRIEF DESCRIPTION OF THE DRAWINGS

The present invention may be better understood, and its numerous objects, features, and advantages made apparent to those skilled in the art by referencing the accompanying drawings.

FIG. 4A is a timing diagram of the three-stage ring oscillator.

The use of the same reference symbols in different drawings indicates similar or identical items.

DETAILED DESCRIPTION

A high-speed, differential 3-stage current-controlled ring oscillator (ICO), generates high-precision in-phase and quadrature-phase (IQ) clocks. These IQ clocks are suitable for use in any high-speed clocking system. The IQ clock generation utilizes a clock interpolation architecture that converts three differential clock signals (six phases) into two differential IQ clocks (four total clocks). In embodiments, after interpolation, the IQ clocks are aligned with sub-picosecond precision. In addition, in embodiments that require DC correction, level-shifting and/or amplitude control, the two differential IQ clocks ae supplied to appropriate correction circuits, such as an AC-coupled level-shifter and clocking network.

Embodiments described herein provide a lower power solution and smaller footprint than the equivalent 4-stage current controlled oscillator solutions previously used in the industry. Embodiments provide the IQ output clocks, while still providing sub-picosecond alignment of the differential IQ output clocks. The alignment precision of course depends on the particular technology employed. Older technology nodes typically provide lower precision and higher technology nodes will generally provide greater precision. Use of the three-stage ring oscillator allows the oscillator to have a greater maximum frequency at the same power point, while maintaining the phase-noise and IQ skew requirements. And because embodiments utilize only a 3-stage ring oscillator, the implementation is smaller than previous solutions. That is, the 3-stages saves layout area compared to a 4-stage solution and thus improves yield as compared to 4-stage solutions. The canonical 3-stage architecture also ensures that there are no oscillation "start-up" issues. Such start-up can be a severe problem and limitation with previous solutions that have an even number of stages. Use of a 3-stage architecture is inherently immune to such oscillation start-up issues. Thus, the three-stage solution consumes less power, utilizes less area, and operates at a higher frequency than previous ICO solutions and it does all of this, while still providing high-precision IQ output clock signals. In an embodiment, the architecture described herein not only provides the IQ clock signals, but it also makes those clock signals available at the voltage of the output domain through use of a clock network coupled to the three-stage oscillator.

Figure 1:
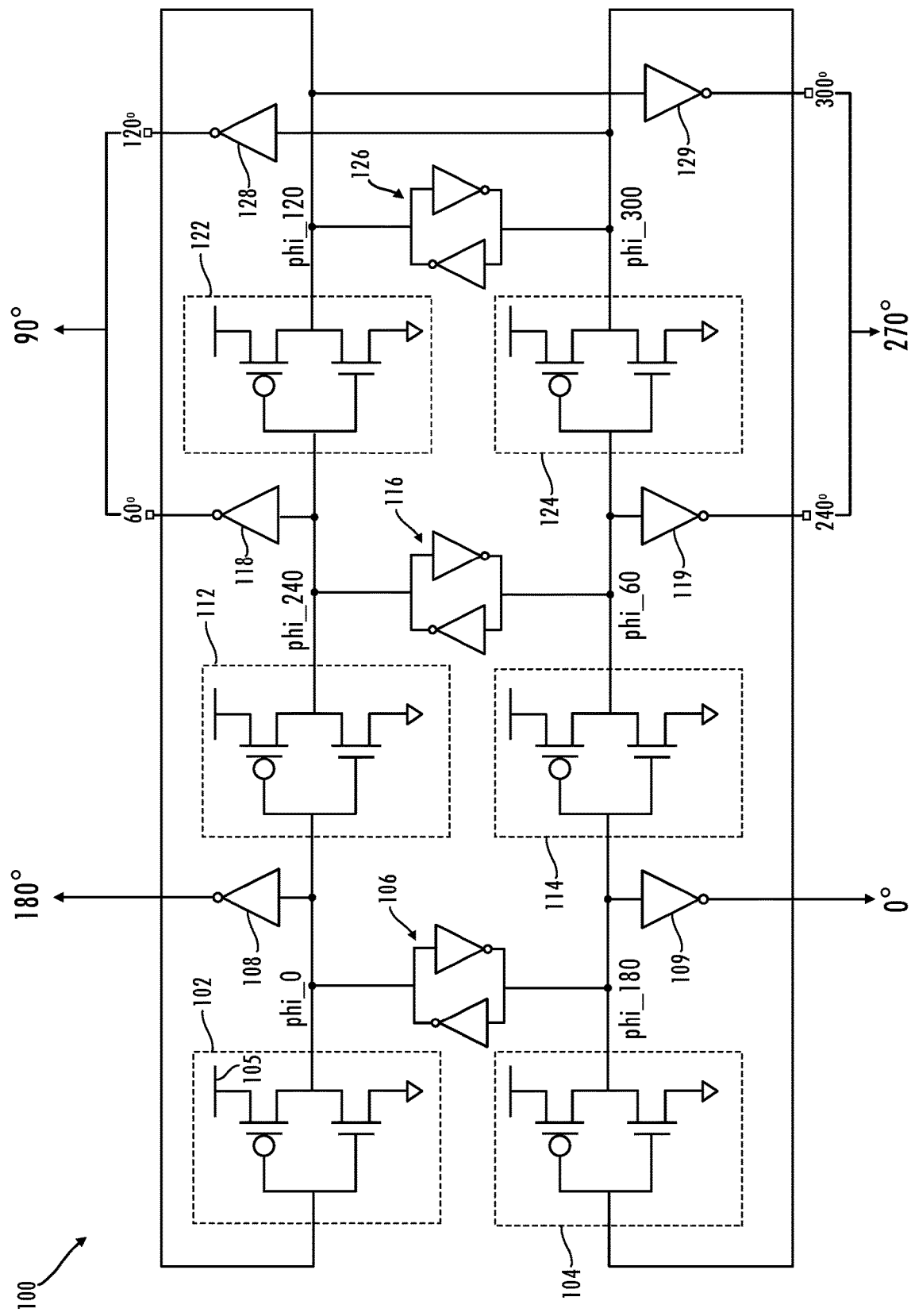
FIG. 1 illustrates a three-stage ring oscillator according to an embodiment.

FIG. 1 illustrates an embodiment of a 3-stage current controlled ring oscillator (ICO). The three stages are differential stages providing anti-phase signals. The first differential stage includes inverter 102 and inverter 104. Inverter 102 provides a first phase signal shown as phi_0 and inverter 104 supplies a second phase signal phi_180 that is 180 degrees from phi_0. A cross coupled pair of inverters 106 couple the outputs of inverters 102 and 104. The cross coupled pair 106 maintains the proper alignment of the two antiphase signals phi_0 and phi_180 generated by the first stage. For convenience the top of the first stage (inverter 102) will be referred to as the positive portion of the first stage and the bottom of the first stage (inverter 104) will be referred to as the negative portion of the first stage. An inverter 108 inverts the output phi_0 of the positive stage to provide a 180° signal. Inverter 109 inverts the output phi_180 of the negative stage to provide the 0° signal. Thus, the first stage provides the differential in-phase clock (I) formed by the clock signals at 0° and 180°.

The second differential stage includes inverter 112 and inverter 114. Inverter 112 provides the signal phi_240. Inverter 114 supplies the phi_60 signal that is 180 degrees from phi_240. A cross coupled pair of inverters 116 couple the outputs of inverters 112 and 114. The cross coupled pair 116 maintains the proper alignment of the two antiphase signals (phi_240 and phi_60) generated by the second stage. For convenience the top of the second stage (inverter 112) will be referred to as the positive portion of the second stage and the bottom of the second stage (inverter 114) will be referred to as the negative portion of the second stage. An inverter 118 inverts the phi_240 signal to generate a 60° signal used for interpolation as described further herein. Inverter 119 inverts the phi_60 signal to generate a 240° signal used for interpolation as described further herein.

The third differential stage includes inverter 122 and inverter 124. Inverter 122 provides the signal phi_120. Inverter 124 supplies the phi_300 signal that is 180 degrees from phi_120. A cross coupled pair of inverters 126 couple the outputs of inverters 122 and 124. The cross coupled pair 126 maintains the proper alignment of the two antiphase signals (phi_120 and phi_300) generated by the third stage. For convenience the top of the third stage (inverter 122) will be referred to as the positive portion of the third stage and the bottom of the third stage (inverter 124) will be referred to as the negative portion of the third stage. An inverter 128 inverts the output phi_300 signal to generate a 120° signal used for interpolation as described further herein. Inverter 129 inverts the phi_120 signal to generate a 300° signal used for interpolation as described further herein.

The output of the inverters 118 and 128 are combined to interpolate between the 60° signal generated by inverter 118 and the 120° signal supplied by inverter 128 to generate the 90° clock signal. The output of the inverters 119 and 129 are combined to interpolate between the 240° signal generated by inverter 119 and the 300° signal supplied by inverter 129 to generate the 270° clock signal. The 90° signal and the 270° signal are 180 degrees out of phase and represent the two clock signals forming the differential Q signal.

Figure 2:
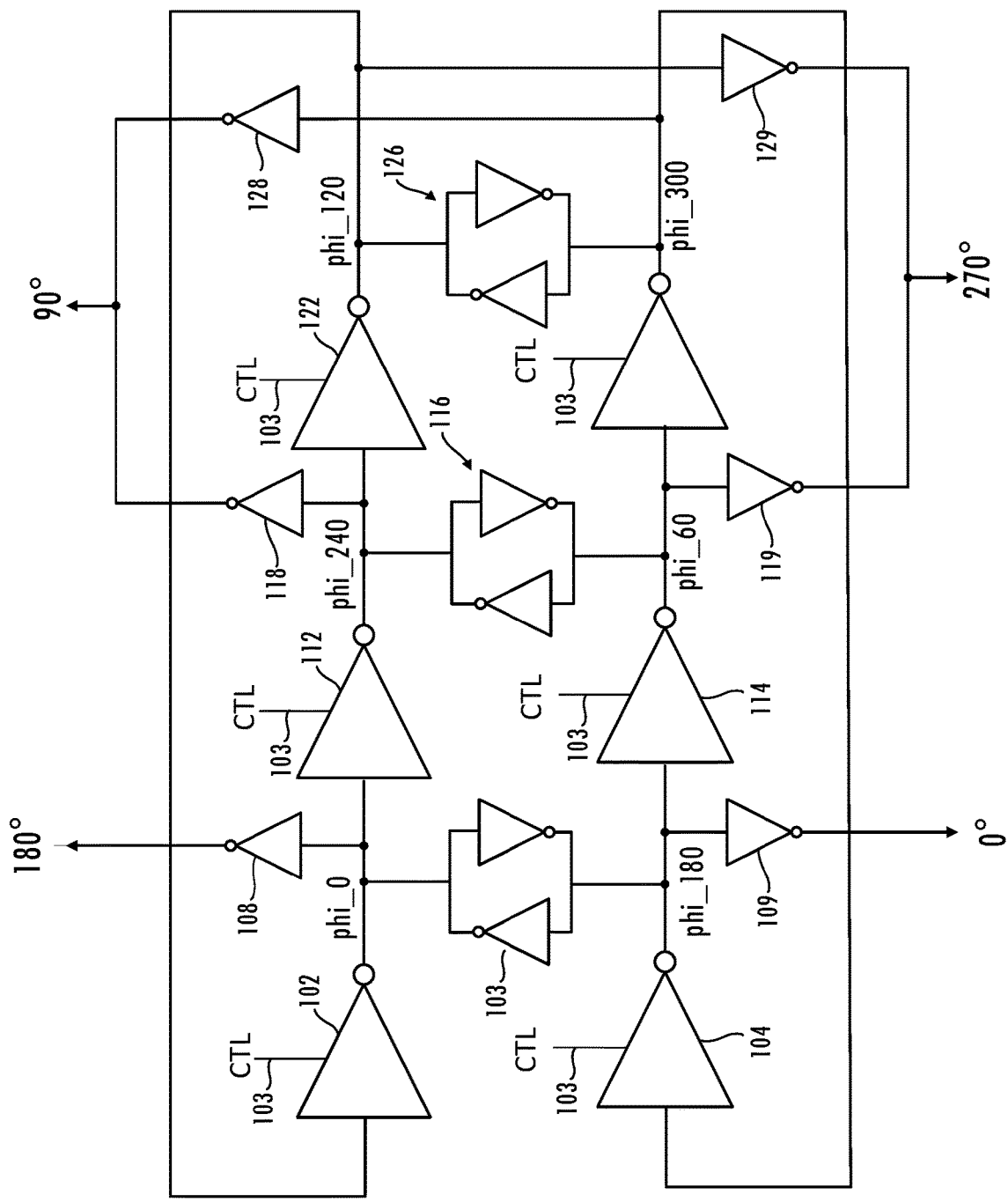
FIG. 2 illustrates another representation of a three-stage ring oscillator according to an embodiment.

Each stage of the 3-stage ring oscillator generates a differential clock signal. Those clock signals are used to generate differential I and Q signals using, in part, interpolation of second and third stage signals. Note that the inverters 108 and 109 provide a delay to match the delay of the interpolators that use inverters 118, 119, 128, and 129 and their combined outputs. FIG. 2 illustrates the same architecture shown in FIG. 1 but shows a control signal CTL 103 being used to control the frequency of the ring oscillator. As stated before, in an embodiment, the ring oscillator in the embodiment of FIG. 1 is an ICO. In one embodiment of the ICO, a current digital to analog converter (IDAC) converts a digital control signal to a current, which is subsequently converted to a voltage and supplied as the supply voltage 105 shown in FIG. 1. Note that only one supply voltage 105 is identified in FIG. 1 for ease of illustration and all six inverter stages are typically coupled to the same supply voltage node. The speed of the oscillation is determined by the digital value supplied to the IDAC. The higher the voltage (greater the current) the faster the ring oscillator oscillates. Thus, the voltage supplied to the inverters controls the oscillation frequency but that voltage varies based on the IDAC current. In other embodiments, the speed of the ring oscillator is determined by digitally programmable capacitive and/or other loading for each stage rather than current.

Inverters 108, 118, 128, and 109, 119, and 129 function as isolation buffers, which are integrated into the core of the ring oscillator and sized in such a way as to minimize the differences in the amplitudes and edge rates of the output clocks. The isolation buffers are there to present a uniform capacitance and resistance to the core of the ring oscillator. That is important since the core of the circuit is very sensitive to any differences in capacitance or resistance around the loop. Thus, the isolation buffers present a uniform impedance to the three stages of the oscillator. The isolation buffers themselves can be as simple as custom-sized inverters or if warranted, more complicated output stages can be used. The buffers present a balanced impedance to the ICO core and shield the core from downstream parasitic variations. The sizing of the buffers is slightly different for the interpolated phases to compensate for the fact that the interpolated outputs are driven by two drivers instead of a single driver. The sizing of the isolation buffers can be done empirically to ensure the amplitudes and phases of all the output clocks are uniform.

Note that while inverters 108, 118, 128, and 109, 119, and 129 are used as isolation buffers to generate the in-phase pair of clock signals and quadrature pair of clock signals, in other embodiments, other types of logic circuits may be used instead such as NAND or NOR gates to allow the clock signals to be turned off in a power savings or test mode or for some other reason. Alternatively, the logic circuit may simply be a buffer circuit to redrive the oscillator stage output signals and provide isolation.

Figure 3:
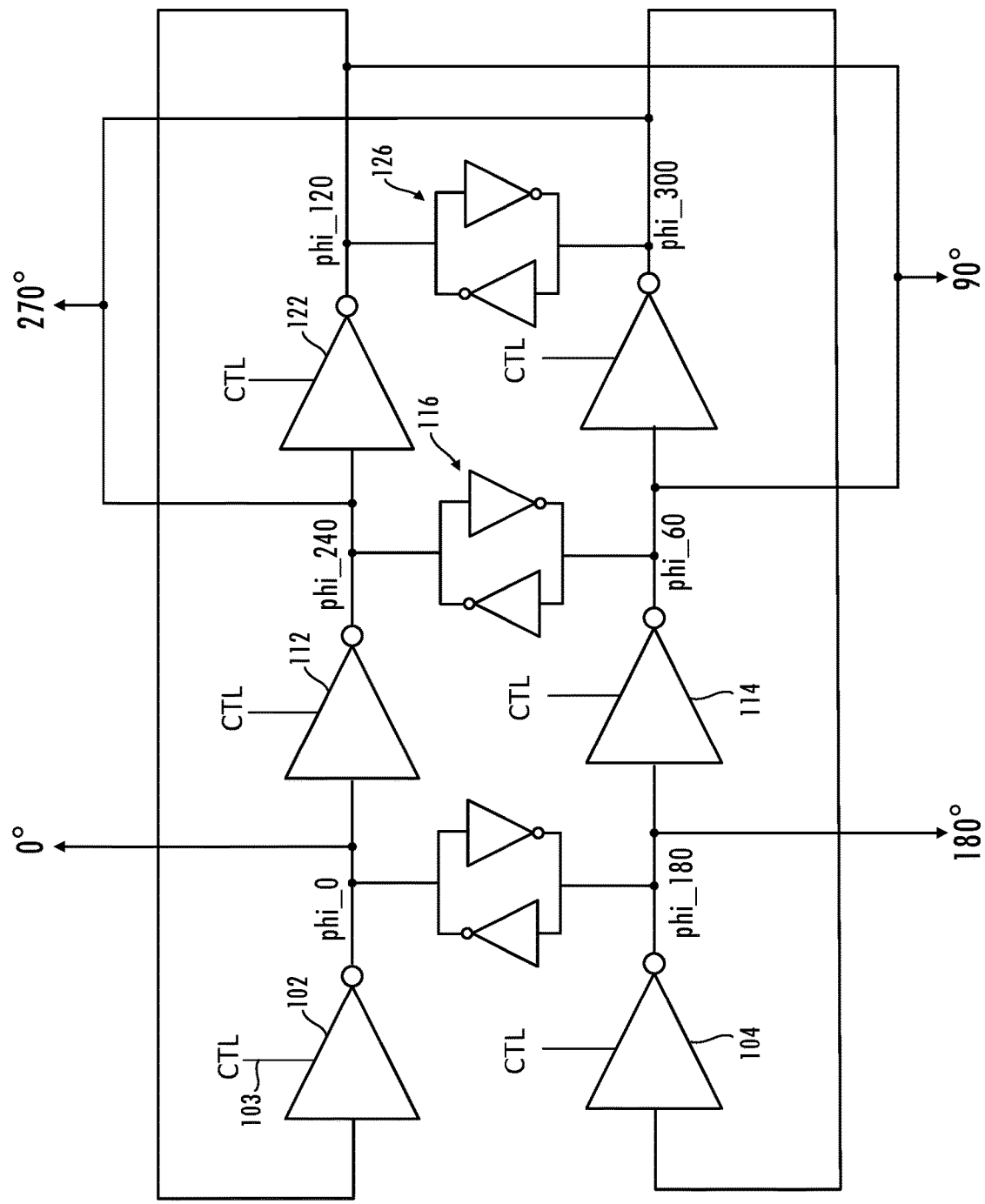
FIG. 3 illustrates another embodiment of a three-stage ring oscillator that directly interpolates signals from the ring oscillator stages.

FIG. 3 illustrates another embodiment in which the interpolation is accomplished by directly interpolating the ph_240 and the ph_300 signals to form the 270° clock signal and directly interpolating the ph_60 and the ph_120 signals to form the 270° clock signal. Thus, the isolation buffers have been removed. That means the inverters (isolation buffers) previously used to form the in-phase clock signals are no longer required and instead the in-phase clock signals are directly formed from the phi_0 and ph_180 signals rather than being indirectly based on the oscillator stage outputs. Of course, removing the isolation buffers from the three stages makes the ring oscillator more susceptible to differences in capacitance and/or resistance around the loop from downstream loading. An embodiment without isolation buffers may be used, e.g., in applications with higher supply voltages and/or lower frequency requirements.

FIG. 4A illustrates a timing diagram associated with the ring oscillator 100 shown in FIGS. 1 and 2. Note that the waveforms shown in FIG. 4A are idealized and in actual operation are more sinusoidal. With reference to FIGS. 1-3 and 4A note that the three differential stages of the ring oscillator provide six phases of the oscillation period that are 60° apart. The two inverters of each stage function as analog bias stages around the oscillator loop. The 90° clock signal is formed by interpolating between the 60° and the 120° signals directly from phi_60 and phi_120 or from inversions of the positive second stage signal phi_240 and the negative third stage signal phi_300. The 270° clock signal is formed by interpolating between the 240° and the 300° signals from phi_240 and phi_300 or from inversions of the negative second stage signal phi_60 and the positive third stage signal phi_120.

Figure 4B:
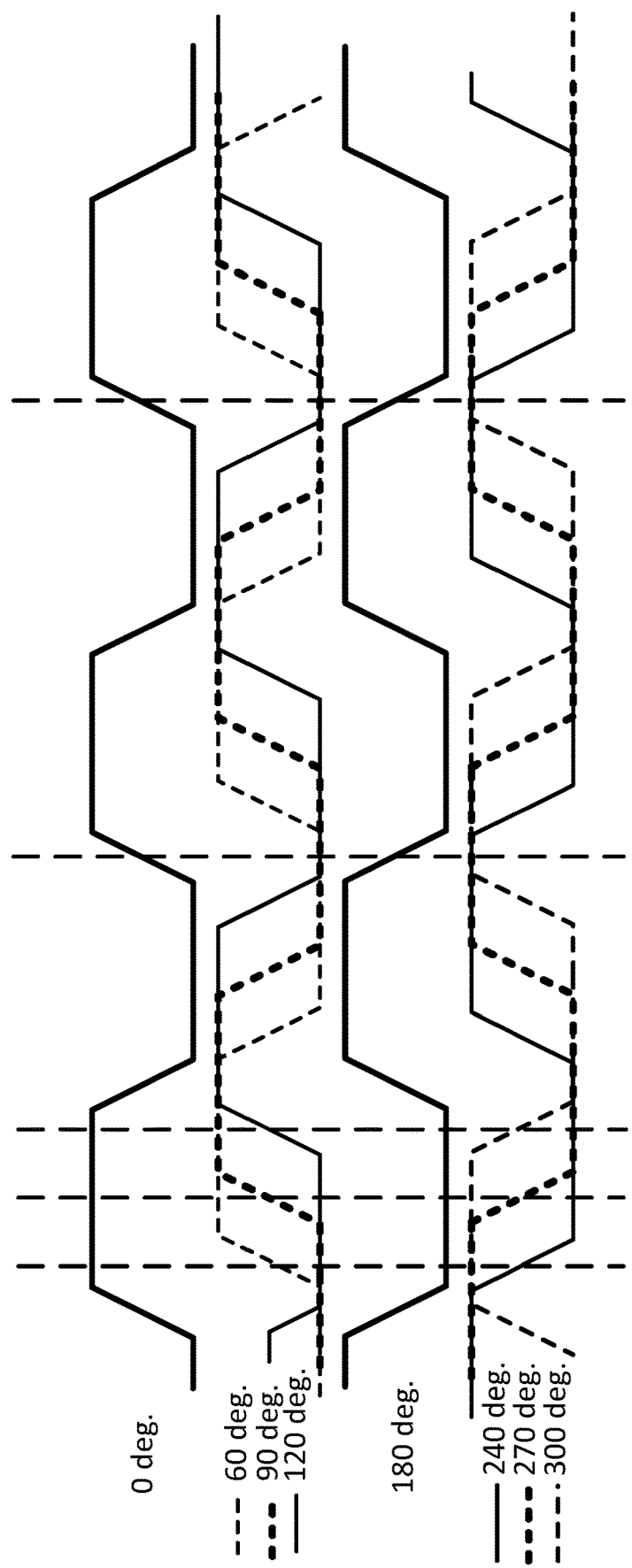
FIG. 4B is a timing diagram of the three-stage ring oscillator showing interpolated clock signals overlaid by the clock signals from which they were formed.

FIG. 4B illustrates a timing diagram showing the interpolated clocks 90° and 270° and the phases from which they are interpolated overlaid along with the 0° and 180° signals of the first stage.

The IQ clocks supplied by ring oscillator 100 are typically low amplitude signals that appear as sinusoidal rather than square waves due to the low voltage supply, the high speed operation, and the RC characteristics of the ring oscillator. Accordingly, in embodiments the IQ clocks supplied by the ring oscillator 100 are coupled with an AC-coupled clock network that provides DC correction, amplitude adjustment, level shifting, and even duty-cycle correction if desired. The level shifting allows a low voltage used in the voltage domain of the ring oscillator to be shifted to a higher target voltage domain. For example, the supply voltage of the ring oscillator may be 500 mV and the target voltage domain may be 1V or even 1.5V.

Figure 5:
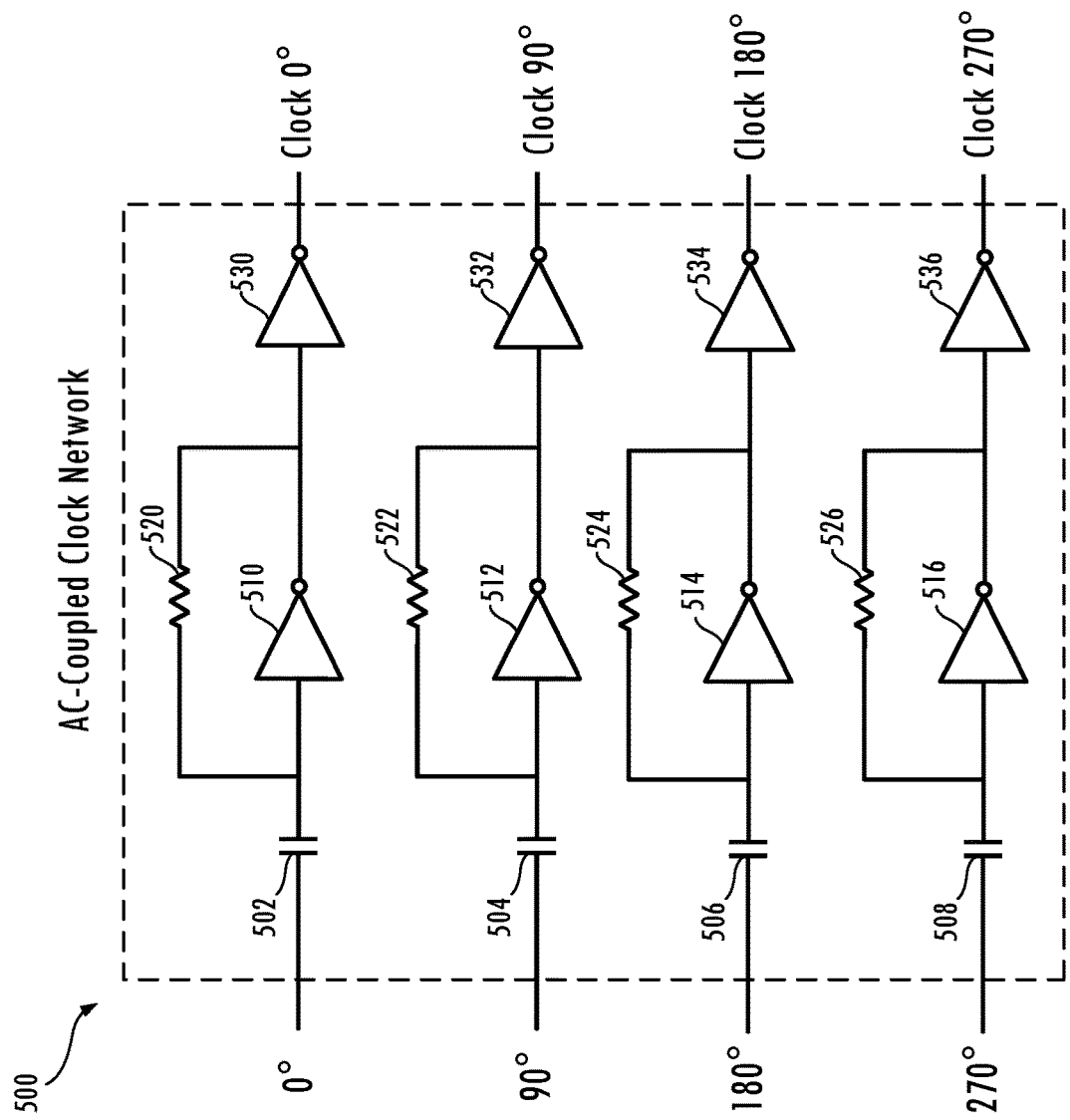
FIG. 5 shows a clock network for coupling to the ring oscillator circuit for amplitude adjustment, DC correction, and level shifting.

FIG. 5 illustrates an example of an AC-coupled clock network 500 that receives the differential IQ clock signals from the ring oscillator 100. The differential IQ clocks received by the AC-coupled clock network 500 are the 0° and 180° I-phase differential pair and the 90° and 270° Q-phase differential pair. The capacitors 502, 504, 506, and 508 provide AC coupling for the clock signals to remove any DC offsets present in the clock signals. The inverter 510 and feedback resistor 520 provides a way to adjust the signal to have sharper edges and translate the signal to a new voltage domain. The feedback resistor 520 sets the threshold at which the inverter 510 switches. Assume, e.g., that the inverter 510 is coupled to a 1V supply voltage and the ring oscillator is in a 500 mV domain. In an embodiment the switching threshold using the feedback resistor 520 is set, e.g., at half the 1V supply (or another desired voltage). That effectively converts the clock signal from the ring oscillator voltage domain to a new voltage domain. The feedback resistors shown in FIG. 5 are typically variable resistors and can be adjusted to desired values. The inverter 530 inverts the output of inverter 510 to supply the 0° clock signal in the new voltage domain with the correct polarity (same polarity as it came in). The inverter/feedback resistor pair 512/522, 514/524, and 516/526 are set to provide the same switching thresholds as pair 510/520. Inverters 532, 534, and 536 supply the correct polarity of, respectively, the 90° clock signal, the 180°, and the 270° signal to the outputs.

The three-stage ring oscillator embodiments described herein can be utilized in various applications that utilize IQ clock signals. In an embodiment, the three-stage ring oscillator provides IQ clock signal having a frequency as high as 20 GHz. Of course, the particular frequency of the IQ clock signals depends on the process technology and application requirements. Embodiments provide high-speed, high-accuracy, small area, and low power, making embodiments useful in many applications. For example, the Peripheral Component Interconnect Express (PCI-e) transfers high speed serial data in one or more lanes in modern computer systems. The clock is embedded in the transferred data. In an embodiment the four output clock signals (the two IQ differential pairs) are used in a clock/data recovery unit (CDR) to recover the clock from the incoming data stream. The various generated clock phases are used to sample the data at different points in the incoming data stream. These various data samples are then used to recreate the original clock signal.

Thus, a differential three stage ring oscillator generating differential I and Q signals has been described. The description of the invention set forth herein is illustrative and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. An apparatus comprising:
   a three-stage differential ring oscillator circuit having a first stage, a second stage, and a third stage;
   wherein the first stage includes a first inverter providing a first inverter output and includes a second inverter providing a second inverter output;
   wherein the second stage includes a third inverter receiving the first inverter output and providing a third inverter output and includes a fourth inverter receiving the second inverter output and providing a fourth inverter output; and
   wherein the third stage includes a fifth inverter receiving the third inverter output and providing a fifth inverter output and includes a sixth inverter receiving the fourth inverter output and providing a sixth inverter output;
   a first interpolator coupled to the third inverter output and the sixth inverter output to generate a first quadrature-phase clock signal of a differential pair of quadrature-phase clock signals; and
   a second interpolator coupled to the fourth inverter output and the fifth inverter output to generate a second quadrature-phase clock signal of the differential pair of quadrature-phase clock signals;
   wherein a first in-phase clock signal of a differential pair of in-phase clock signals is generated based on the first inverter output;
   wherein a second in-phase clock signal of the differential pair of in-phase clock signals is generated based on the second inverter output; and
   an AC-coupled clock network circuit coupled to receive the differential pair of quadrature-phase clock signals and the differential pair of in-phase clock signals.

2. The apparatus as recited in claim 1,
   wherein the first interpolator includes a first isolation buffer circuit having an input coupled to the third inverter output and a second isolation buffer circuit having an input coupled to the sixth inverter output, outputs of the first isolation buffer circuit and the second isolation buffer circuit being coupled together to form the first quadrature-phase clock signal of the differential pair of quadrature-phase clock signals;
   wherein the second interpolator includes a third isolation buffer circuit having an input coupled to the fourth inverter output and a fourth isolation buffer circuit having an input coupled to the fifth inverter output, outputs of the third isolation buffer circuit and the fourth isolation buffer circuit being coupled together to form the second quadrature-phase clock signal of the differential pair of quadrature-phase clock signals;

a fifth isolation buffer circuit having an input coupled to the first inverter output and supplying the first in-phase clock signal of the differential pair of in-phase clock signals; and a sixth isolation buffer circuit having an input coupled to the second inverter output and supplying the second in-phase clock signal of the differential pair of in-phase clock signals.

3. The apparatus as recited in claim 1 wherein the first interpolator is formed by directly connecting outputs of the third inverter and the sixth inverter and the second interpolator is formed by directly connecting outputs of the fourth inverter and the fifth inverter.

4. The apparatus as recited in claim 1 further comprising:
a first cross coupled inverter pair coupling the first inverter output and the second inverter output;
a second cross coupled inverter pair coupling the third inverter output and the fourth inverter output; and
a third cross coupled inverter pair circuit coupling the fifth inverter output and the sixth inverter output.

5. The apparatus as recited in claim 1 wherein an input of the first inverter is coupled to the fifth inverter output and an input of the second inverter is coupled to the sixth inverter output.

6. A method comprising:
generating six clock signal phases in a three-stage differential ring oscillator circuit;
generating a differential pair of in-phase clock signals and a differential pair of quadrature-phase clock signals using the six clock signal phases; and
supplying the differential pair of in-phase clock signals and the differential pair of quadrature-phase clock signals to an AC-coupled clock network circuit.

7. The method as recited in claim 6 further comprising:
generating a first inverter output from a first inverter in a first stage of the three-stage differential ring oscillator circuit and generating a second inverter output from a second inverter in the first stage;
generating a third inverter output from a third inverter in a second stage of the three-stage differential ring oscillator circuit and generating a fourth inverter output from a fourth inverter in the second stage; and
generating a fifth inverter output from a fifth inverter in a third stage of the three-stage differential ring oscillator circuit and generating a sixth inverter output from a sixth inverter in the third stage.

8. The method as recited in claim 7 further comprising:
generating a first quadrature-phase clock signal of the differential pair of quadrature-phase clock signals by interpolating between the third inverter output and the sixth inverter output; and
generating a second quadrature-phase clock signal of the differential pair of quadrature-phase clock signals by interpolating between the fourth inverter output and the fifth inverter output.

9. The method as recited in claim 8 further comprising:
receiving the third inverter output at a first isolation buffer and supplying a first buffer signal from the first isolation buffer;
receiving the sixth inverter output at a second isolation buffer and supplying a second buffer signal from the second isolation buffer;
coupling the first buffer signal and the second buffer signal together to generate the first quadrature-phase clock signal;

receiving the fourth inverter output at a third isolation buffer and supplying a third buffer signal from the third isolation buffer;
receiving the fifth inverter output at a fourth isolation buffer and supplying a fourth buffer signal from the fourth isolation buffer; and
coupling the third buffer signal and the fourth buffer signal together to generate the second quadrature-phase clock signal.

10. The method as recited in claim 8 further comprising generating a first in-phase clock signal of the differential pair of in-phase clock signals based on the first inverter output of the first stage and generating a second in-phase clock signal of the differential pair of in-phase clock signals based on the second inverter output of the first stage.

11. The method as recited in claim 10 further comprising generating the first in-phase clock signal by inverting the first inverter output of the first stage and generating the second in-phase clock signal by inverting the second inverter output of the first stage.

12. The method as in claim 10 further comprising:
coupling the first inverter output of the first stage and the second inverter output of the first stage with a first cross coupled circuit;
coupling the third inverter output of the second stage and the fourth inverter output of the second stage with a second cross coupled circuit; and
coupling the fifth inverter output of the third stage and the fourth inverter output of the third stage with a third cross coupled circuit.

13. An apparatus comprising:
a three-stage differential ring oscillator circuit configured to generate six clock signal phases;
a first interpolator to interpolate between a first phase and a second phase of the six clock signal phases to generate a first clock signal of a first differential pair of quadrature-phase clock signals;
a second interpolator to interpolate between a third phase and a fourth phase of the six clock signal phases to generate a second clock signal of the first differential pair of quadrature-phase clock signals;
wherein a third clock signal of a second differential pair of in-phase clock signals is generated based on a fifth phase of the six clock signal phases and a fourth clock signal of the second differential pair of in-phase clock signals is based on a sixth phase of the six clock signal phases; and
an AC-coupled clock network circuit coupled to receive the first differential pair of quadrature-phase clock signals and the second differential pair of in-phase clock signals.

14. The apparatus as recited in claim 1 wherein the three-stage differential ring oscillator circuit provides six phases of an oscillation period of the three-stage differential ring oscillator circuit that are 60 degrees apart.

15. The method as recited in claim 6 wherein the six clock signal phases are 60 degrees apart.

16. The apparatus as recited in claim 1,
wherein the AC-coupled clock network circuit further comprises respective capacitors coupled to the differential pair of quadrature-phase clock signals and the differential pair of in-phase clock signals to thereby remove DC offsets present in the differential pair of quadrature-phase clock signals and the differential pair of in-phase clock signals; and
wherein the three stage ring oscillator circuit operates in a first voltage domain and the AC-coupled clock network circuit operates in a second voltage domain higher than the first voltage domain and the AC-coupled clock network circuit provides voltage translation from the first voltage domain to the second voltage domain.

17. The apparatus as recited in claim 13 wherein the AC-coupled clock network circuit further comprises:
respective capacitors coupled to the first differential pair of quadrature-phase clock signals and the second differential pair of in-phase clock signals to thereby remove DC offsets present in the first differential pair of quadrature-phase clock signals and the second differential pair of in-phase clock signals; and
a plurality of level shifting circuits to shift respective ones of the first differential pair of quadrature-phase clock signals and the second differential pair of in-phase clock signals to a higher voltage domain, each of the level shifting circuits including an inverter coupled to one of the capacitors and a feedback resistor coupled between an input of the inverter and an output of the inverter.

18. The method as recited in claim 6 further comprising:
supplying the differential pair of quadrature-phase clock signals and the differential pair of in-phase clock signals to respective capacitors in the AC-coupled clock network circuit to thereby provide AC-coupling and thereby remove DC offsets present in the differential pair of quadrature-phase clock signals and the differential pair of in-phase clock signals.

19. The apparatus as recited in claim 2 wherein the first, second, third, and fourth isolation buffer circuits are different in size than the fifth and sixth isolation buffer circuits.

20. The method as recited in claim 6 further comprising:
operating the three-stage differential ring oscillator circuit in a first voltage domain;
operating the AC-coupled clock network circuit in a second voltage domain; and
translating the differential pair of in-phase clock signals and the differential pair of quadrature-phase clock signals from the first voltage domain to the second voltage domain using the AC-coupled clock network circuit.

* * * * *